United States Patent [19]

Simons

[11] Patent Number: 6,066,215
[45] Date of Patent: May 23, 2000

[54] METHOD OF FORMING A COLORED IMAGE SIGN USING INK JET PRINTING

[75] Inventor: Michael J. Simons, Eastcote, United Kingdom

[73] Assignee: Eastman Kodak Company, Rochester, N.Y.

[21] Appl. No.: 09/089,774

[22] Filed: Jun. 3, 1998

[30] Foreign Application Priority Data

Jun. 4, 1997 [GB] United Kingdom .................... 9711427

[51] Int. Cl.$^7$ .............................. B05D 3/10; B05D 5/06; B31B 1/60
[52] U.S. Cl. ............................ 156/60; 427/261; 427/264; 427/340; 427/341
[58] Field of Search ........................... 101/463.1; 347/96; 427/256, 258, 261, 264, 333, 340, 391, 352; 156/59, 63, 100, 60

[56] References Cited

U.S. PATENT DOCUMENTS

| | | |
|---|---|---|
| 3,811,882 | 5/1974 | Henry . |
| 4,503,110 | 3/1985 | Skene . |
| 4,710,444 | 12/1987 | Leenders et al. . |
| 4,798,741 | 1/1989 | Nelson . |
| 4,933,213 | 6/1990 | Fourquier et al. ..................... 427/302 |
| 4,973,543 | 11/1990 | Reinhold . |
| 4,992,355 | 2/1991 | Reinhold . |
| 5,270,078 | 12/1993 | Walker et al. ........................... 427/264 |
| 5,380,769 | 1/1995 | Titterington et al. ................... 523/161 |
| 5,466,653 | 11/1995 | Ma et al. ................................ 503/200 |

FOREIGN PATENT DOCUMENTS

| | | |
|---|---|---|
| 3226177 | 2/1983 | Germany . |
| 5173010A | 7/1993 | Japan . |
| 89493 | 5/1986 | Romania . |
| 355303 | 8/1931 | United Kingdom . |
| 1 431 462 | 4/1976 | United Kingdom . |
| 1431462 | 4/1976 | United Kingdom . |

*Primary Examiner*—Fred J. Parker
*Attorney, Agent, or Firm*—Harold E. Cole

[57] ABSTRACT

The method relates to a method comprising providing a coating of a cross-linkable polymeric substance on a transparent or translucent substrate, applying a pattern of cross-linker to said coated substrate by ink jet printing to cross-link said polymeric substance in the pattern of the crosslinker, washing the coated substrate to remove cross-linkable polymer in the area not having the pattern of cross-linker applied thereto, and applying a contrasting color layer to the hardened cross-linked polymeric material.

8 Claims, No Drawings

METHOD OF FORMING A COLORED IMAGE SIGN USING INK JET PRINTING

FIELD OF THE INVENTION

The invention relates to forming an image by selectively crosslinking a substrate by ink jet printing a crosslinker onto to a crosslinkable polymeric substrate.

BACKGROUND OF THE INVENTION

It has been known to form images by selectively crosslinking materials by applying light to a cross-linkable resin. The technique has been used for forming photoresists where, after uncrosslinked material has been removed, etching of metal or glass is carried out. The technique has also been used to form silk-screen or screen-printing materials where the uncrosslinked material is washed out of the screen to create the finished printing screen. Such techniques are disclosed in "Light Sensitive Systems" by J. Kosar, published by John Wiley and Sons, Inc., New York, 1965, and in "Screen Process Printing" by J.Stephens, published by Blueprint (an imprint of Chapman and Hall), London, 1996.

The prior techniques, while successful, are expensive as they require expensive light imaging apparatus. Further they require expensive resins that will cross-link when exposed to light. There is difficulty in forming thick coats of crosslinked polymer as the light can not penetrate through thick cross-linkable resins, particularly when they are coloured. Further, only very expensive imaging equipment could accurately produce fine quality images.

In forming of signs and posters there is a need for signs that are low in cost but very resistant to damage and wear. There is a need for small businesses and in the home to make posters, signs and notices that will last and are suitable for outdoor use. While the making of banners and posters are well known, they are on paper that in large pieces can not be hung and are easily damaged by wind, rain, and handling.

PROBLEM TO BE SOLVED BY THE INVENTION

There is a need for a method for forming signs in hardened polymeric images in layers of crosslinkable materials that are accurate, low in cost, colorful, and wear resistant.

SUMMARY OF THE INVENTION

It is an object of the invention to overcome disadvantages of forming images by the prior methods.

It is another object of the invention to produce low cost and accurate signs and posters.

These and other objects of the invention are generally accomplished by a method comprising providing a coating of a cross-linkable polymeric substance on a transparent or translucent substrate, applying a pattern of cross-linker to said coated substrate by ink jet printing to cross-link said polymeric substance in the pattern of the crosslinker, washing the coated substrate to remove cross-linkable polymer in the area not having the pattern of cross-linker applied thereto, and applying a contrasting colour layer to the hardened cross-linked polymeric material.

ADVANTAGEOUS EFFECT OF THE INVENTION

The invention forms accurate low cost, wear resistant posters and signs using materials that are not light sensitive.

DETAILED DESCRIPTION OF THE INVENTION

The invention has numerous advantages over previous processes of forming crosslinked images in crosslinkable materials. The invention is low in cost and uses the common ink jet printer to create accurate and low cost images. This printing technique allows images to be formed by printing from a computer onto a substrate that does not have to kept in the dark. The substrate may be formed of a dry material such as gelatine that may be easily handled in the light and then washed with water to remove uncross-linked portions. The material does not need to be flat during imaging as in many light exposing techniques.

The method is much simpler to operate than existing decoration or fabrication techniques using light-induced hardening of polymeric layers by light exposure through an optical pattern. It does not involve light-sensitive materials, nor toxic materials like potassium dichromate. It provides a versatile decoration and fabrication technique to anyone with a computer and ink-jet printer fitted with a suitable cartridge, and has the potential to open a wide range of craft applications involving decoration and images to a large number of people. These and other objects will become apparent from the detailed description below.

The inventive method of making signs and notices comprises taking a sheet of transparent or translucent plastic support material such as photographic film base, which has been coated with a layer of cross-linkable water-soluble polymer such as gelatine in which is dispersed a light-scattering or coloured pigment, writing to it with an ink jet printer using an ink which can cross-link the water-soluble polymeric material, then washing out the unhardened polymeric material and its associated pigment by means of an aqueous treatment so as to leave a retained pattern of hardened pigmented polymeric material, then applying a contrasting layer to the same side of the support material as the hardened pigmented polymeric material so that when viewed through the transparent support the pattern of hardened pigmented polymeric material gives a visible pattern forming a sign or notice. The contrasting layer may be reflective or transmissive, and can be a layer of paint, either solvent- or water-based, or a sheet of contrasting material attached to the imaged sheet by means of an adhesive. The pattern, which must be written by the printer in laterally reversed or mirror-image form, may consist of letters, numbers, symbols or pictorial matter. In the case of pictorial patterns, it may be necessary to render the pattern in half-tone form.

The contrasting layer may be formed of any suitable material. If the contrasting material is a sheet it may be formed of any stable material that may be coloured either by surface coat or by mixing pigment or dye into the polymer at the time of formation of the sheet. Suitable sheets for the contrasting material for the invention are those of polyester, polyolefins such as polyethylene and polypropylene, and cellulose acetate. The colour contrast sheet is selected to give the best combination of wear and cost to the finished product. When the contrasting layer is a paint it may be any paint that is compatible with the crosslinked polymer forming the image. Preferred are the paints with a water carrier as such paints will not dissolve the substrate or cross-linked material to which they are applied.

The embodiment where a sheet is attached to the substrate bearing the image may use any suitable adhesive which will bind with the contrasting colour sheet and with the image and substrate. For gelatine images a polyethylene adhesive is suitable. It also possible that a colour contrasting sheet could be attached by heat fusing to the substrate and image.

The invention method uses relatively inexpensive and widely available equipment, in the form of an ink jet printer with a computer to drive it. The operation is relatively simple-print, wash off, dry, apply colour contrast backing.

It may thus be done by non-specialists, allowing in-house or even domestic making of notices and posters. The resulting notice, poster, or sign is protected from the weather by the transparent support substrate at the front, and by the colour contrast backing at the rear. The pigment in the polymer may be chosen to give the desired hue which could be very intense, and to have high stability to light in ambient conditions. It can also be chosen to give special effects, such as a metallic, pearlescent, sparkling or "day-glo" appearance: such effects could alternatively or additionally be provided in the contrasting layer. Since ink-jet printers are available in wide formats, and can print long lengths, large signs can be fabricated as well as small ones.

Relative to making notices by printing with normal ink-jet inks, the pigmented gelatine offers potentially high light stability, wider colour gamut by suitable choice of pigment, special effects as noted above, and an image which resists lateral diffusion or bleeding when the colour contrasting layer is applied.

The invention comprises a process for printing, marking or fabricating images or marks from electronic information by writing by means of an ink-jet printer which deposits in a pattern a cross-linking fluid onto a substrate which bears a layer of cross-linkable or hardenable polymeric material, and then treating the substrate to cause a distribution of hardened crosslinked polymeric material according to the deposited pattern. The pattern in polymeric material may constitute the desired image, or may be subsequently treated for example by dyeing to give the desired image prior to having the contrasting layer of the invention applied to the hardened image.

For example, gelatine has been found to be a suitable cross-linkable polymeric material, and suitable cross-linker fluids for gelatine include aqueous solutions of polyvalent metal salts such as aluminium or chromium (III) sulphates, and/or aqueous solutions of aldehydes such as formaldehyde or glutaraldehyde. After application of the pattern of cross-linking fluid, the unhardened gelatine may be removed by washing with warm (>35° C.) water to leave a residual pattern in hardened gelatine, which may contain a dye or pigment, or may be subsequently dyed or pigmented.

Various other methods of decoration or fabrication based on the general principles of the invention may be envisaged.

Any suitable cross-linkable polymeric material may be used in the invention. Typical materials include polymeric materials having carboxylic acid, amino, hydroxyl, unsaturated or epoxy functional groups. Suitable cross-linkable polymeric materials are gelatine, polymers of acrylic, methacrylic or maleic acid or anhydride or their copolymers with ethylene, styrene or vinyl ethers, and polyamine polymers such as polyethyleneimine. Most preferred is gelatine as it is safe, easily coated, and readily washed off if not cross linked. The gelatine may be present with other polymeric materials, particularly carboxylic acid-containing polymers and gelatine-compatible latexes.

The substrate may be any suitable material for printing with an ink jet printer. Suitable substrate materials are translucent paper, and translucent plastic sheets. Translucent as used here means a material that allows the viewer to see through the material enough to see poster like images on the other side. Frosted plastic sheet is a translucent material. The plastic polymer sheet may be any of the common plastic sheet materials such as polyester, cellulose acetate, and polyolefin sheets. The use of a transparent plastic sheet is preferred as this allows the formation in a low cost manner of a clear, bright sign or poster of high quality and high wear resistance.

Any suitable ink jet printer may be used in the invention. The printer must be able to operate with a solution of the crosslinker substituted for the standard ink cartridge. As is known ink jet printers of the "drop on demand" type generally operate by ejecting ink droplets by means of a pressure pulse induced by a piezoelectric impulse or by a thermal pulse ("bubble jet"). Either type of printer is suitable for the invention, provided that the solution of the crosslinker is formulated to have chemical and physical properties, including viscosity and surface tension, appropriate to the printer.

Other types of ink jet printer may also be used, including "continuous working" types which eject a continuous stream of droplets which are deflected by an electrostatic field as required, while other types may use a long array of ink jet nozzles. The transport of the substrate to be printed can be varied to suit. For instance, film or paper substrates can be transported round rollers in the printer in the normal way, but a printing screen held on a frame would require a flat bed transport system so the whole frame can be transported past the print head.

The cross-linker material will depend on what cross-linkable polymeric substance is used in the process. Any material that may be placed in a liquid suitable for use in an ink jet may be used. Many materials are known to act as hardening or crosslinking agents for gelatine, see for example chapter 2 of "The Theory of the Photographic Process", Fourth Edition, edited by T. H. James and published by the Eastman Kodak Company, 1977. Crosslinking agents for gelatine include metal salts, aldehydes, N-methylol compounds, diketone compounds, sulphonate esters and sulphonyl halides, S-triazines, and active olefins including bis-vinyl sulphonyl compounds.

Especially suitable materials as the crosslinker for gelatine include aqueous solutions of aldehydes including formaldehyde, glyoxal and glutaraldehyde; and aqueous solutions of polyvalent metal salts such as $Al^{3+}$, $Cr^{3+}$, $Fe^{3+}$, $Ce^{4+}$. The preferred crosslinkers for the gelatines are glutaraldehyde and trivalent metal salts. Also preferred are the aqueous salts of Al(III) and Cr(III), including their chlorides, sulphates and nitrates. The preferred cross-linkers for the carboxylic acid polymers and copolymers are trivalent metal salts. Most preferred are the aqueous salts of Al(III) and Cr(III), including their chlorides, sulphates and nitrates. The preferred crosslinkers for amine-bearing polymers are aldehydes and active vinyl compounds.

The liquid carrier material used in the ink jet cartridge may be any material that is compatible with the crosslinker. The preferred carrier liquid for the crosslinker is water, but other solvents or cosolvents may be present. For the preferred metal salts the solvent would be substantially water. Humectant agents which are commonly present in ink-jet inks may be present, and these include high boiling point liquids such as glycerol, ethylene glycol, diethylene glycol, triethylene glycol and 2-pyrrolidinone, as well as solids with a high affinity for water such as trimethylolpropane. Other substances present in the liquid in the ink jet cartridge may include anti-bacterial agents and thickening agents. The various substances present in the carrier liquid for the crosslinker must be compatible with the crosslinker and with the ink-jet mechanism.

Other fillers and additives such as known in the art may be used in the crosslinkable polymeric materials of the invention. Typical of such materials are bactericides, fillers, ultraviolet absorbers and brighteners.

The polymeric materials may be coloured before or after ink jet printing. The colorants are those such as anionic dyes such as Tartrazine or Acid Blue 92, cationic dyes such as Rhodamine 6G or Crystal Violet, zwitterionic dyes such as Acid Fuchsin, or finely dispersed pigments such as titanium dioxide or copper phthalocyanine. If colorants are added in a wash after hardening they may be the same or different.

The following examples illustrate the practice of this invention. They are not intended to be exhaustive of all possible variations of the invention. Parts and percentages are by weight unless otherwise indicated.

EXAMPLES

Example 1

Clear polyethylene terephthalate film base was coated with an underlayer of gelatin at 1.5 g of gelatin per square meter together with 0.009 g per square meter of the hardener bis(vinylsulphonylmethane). The dried coating was left to harden for a few days and then overcoated with a pigmented gelatine layer by coating at 99 ml per square meter the following composition:

| | |
|---|---|
| Gelatine solution, 8.9% w/w in water | 360 g |
| Winsor and Newton Ultramarine Poster Colour, Blue | 40 g | the Poster Colour having been thoroughly dispersed into the gelatine solution by stirring.

When dry, a portion of the coating was placed in a Hewlett Packard Deskjet 850C Ink Jet Printer® and written to using the following hardening "ink" which had been loaded into an ink cartridge:

| | |
|---|---|
| aluminium nitrate, hydrated | 10 g |
| aluminium sulphate, hydrated | 10 g |
| ethylene glycol | 10 g |
| glutaraldehyde, 50% w/w aqueous solution | 3 g |
| water | 67 g |

The cross linker "ink" on the coating was allowed to dry, then the coating was washed in running water at 40° C. The blue pigmented layer washed away where the "ink" had not been applied, and remained where it had, to give the written characters on a clear background. The characters were written laterally reversed when viewed from the coated side. The coating was allowed to dry, then a white cellulose-based spray paint was sprayed on to the coated side. When dry, the coating was viewed from the uncoated side, and showed sharply depicted right-reading blue letters against a white background.

Example 2

A dispersion of titanium dioxide was made as follows:

| | |
|---|---|
| titanium dioxide (grade R-XL, supplied by Tioxide Europe Ltd) | 60 g |
| water | 75 g |
| tri-isopropyl naphthalene sulphonate 10% w/w aqueous solution | 1.0 g | were weighed into a 300 ml glass jar which was one third filled with 4 mm diameter glass beads. The jar was rotated on rollers for 24 hours to ball-mill the contents, which gave a fine, smooth white dispersion.

A coating was prepared by melting and mixing together, at 40° C.,

| | |
|---|---|
| 12.5% w/w aqueous gelatine solution | 10 g |
| titanium dioxide dispersion | 4 g |
| water | 2 g | and coating the resultant composition at approximately 100 ml per square meter on polyethylene terephthalate film base (of about 175 micrometer thickness).

When dry, a portion of the coating was placed in a Hewlett Packard Deskjet 850C. Ink Jet Printer and written to using the following hardening cross linker "ink" which had been loaded into an ink cartridge:

| | |
|---|---|
| chrome alum | 5.0 g |
| aluminium chloride, hydrated | 3.0 g |
| Triton X100 ® surfactant, 10% w/w aqueous solution | 0.5 g |
| 2% w/w aqueous solution of Victoria Blue dye | 2 g |
| water | 67 g |

The cross-linker "ink" on the coating was allowed to dry, then the coating was washed in running water at 40° C. The white pigmented layer washed away where the "ink" had not been applied, and remained where it had. The characters were written laterally reversed when viewed from the coated side, and were written in negative mode, so that after washing the letters appeared as clear film against a continuous white background. The coating was allowed to dry, then coloured cellulose-based spray paint was sprayed on to the coated side, different colours, including in some cases metallic effect colours, to each letter. When dry, the coating was viewed from the uncoated side, and showed sharply depicted right-reading letters of various colours against a white background.

I claim:

1. A method of forming a sign comprising providing a coating of a coloured cross-linkable polymeric substance on a transparent or translucent substrate, applying a pattern of cross-linker to said coated substrate by ink jet printing to cross-link and harden said coloured polymeric substance in the pattern of the crosslinker, washing the coated substrate to remove cross-linkable polymer in the area not having the pattern of cross-linker applied thereto, and applying a contrasting colour layer to the hardened, coloured cross-linked polymeric material, so that when viewed through said substrate, said pattern of hardened, coloured cross-linked polymeric material produces a visible pattern forming a sign.

2. The method of claim 1 wherein said cross-linkable polymeric substance comprises gelatine.

3. The method of either of claims 1 or 2 wherein said contrasting colour layer is a layer of paint.

4. The method according to claim 1 wherein said cross-linkable polymeric substance is selected from at least one of the group consisting of polymers of acrylic, methacrylic, maleic acid, maleic anhydride and their copolymers with ethylene, styrene or vinyl-ethers.

5. The method according to claim 1 wherein said cross-linker comprises an aqueous solution of a polyvalent metal salt.

6. The method according to claim 1 wherein said crosslinker is selected from the group consisting of formaldehyde, glyoxal and glutaraldehyde.

7. The method of claim 1 wherein the contrasting colour layer comprises a sheet of plastic.

8. The method of claim 7 wherein said sheet of plastic is adhesively connected to said substrate and the cross-linked image.

* * * * *